United States Patent
Zhang (10) Patent No.: US 11,705,167 B2
(45) Date of Patent: Jul. 18, 2023

(54) MEMORY CIRCUIT, METHOD AND DEVICE FOR CONTROLLING PRE-CHARGING OF MEMORY

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 168 days.

(21) Appl. No.: 17/470,895

(22) Filed: Sep. 9, 2021

(65) Prior Publication Data

US 2022/0319560 A1 Oct. 6, 2022

Related U.S. Application Data

(63) Continuation of application No. PCT/CN2021/106734, filed on Jul. 16, 2021.

(30) Foreign Application Priority Data

Mar. 31, 2021 (CN) .......................... 202110352501.6

(51) Int. Cl.
*G11C 7/10* (2006.01)
*G11C 5/06* (2006.01)
(Continued)

(52) U.S. Cl.
CPC .............. *G11C 7/1048* (2013.01); *G11C 5/06* (2013.01); *G11C 5/14* (2013.01); *G11C 7/109* (2013.01); *G11C 7/1063* (2013.01); *G11C 7/222* (2013.01)

(58) Field of Classification Search
CPC ................................ G11C 7/1048; G11C 7/10
(Continued)

(56) References Cited

U.S. PATENT DOCUMENTS

| 5,245,579 A | 9/1993 | Ohta |
| 5,815,451 A | 9/1998 | Tsuchida |

(Continued)

FOREIGN PATENT DOCUMENTS

| CN | 1497607 A | 5/2004 |
| CN | 101017703 A | 8/2007 |

(Continued)

*Primary Examiner* — Muna A Techane
(74) *Attorney, Agent, or Firm* — Cooper Legal Group, LLC (57) ABSTRACT

A memory circuit includes a pre-charging circuit and a control circuit. The pre-charging circuit includes a first pre-charging unit, a second pre-charging unit, a first power supply terminal, a second power supply terminal, a first control terminal, a second control terminal and a data terminal; the first pre-charging unit is connected with the first power supply terminal, the first control terminal and the data terminal; the second pre-charging unit is connected with the second power supply terminal, the second control terminal and the data terminal. The control circuit is configured to in response to a memory being in a row active state and not performing a reading-writing operation, control, through the second pre-charging unit, the data terminal and the second power supply terminal to be disconnected, and control, through the first pre-charging unit, the data terminal and the first power supply terminal to be disconnected.

16 Claims, 5 Drawing Sheets

(51) Int. Cl.
  *G11C 7/22* (2006.01)
  *G11C 5/14* (2006.01)
(58) Field of Classification Search
  USPC .......................................................... 365/203
  See application file for complete search history.

(56) References Cited

U.S. PATENT DOCUMENTS

| | | | |
|---|---|---|---|
| 7,027,340 B2* | 4/2006 | Huang | G11C 7/065 |
| | | | 326/98 |
| 8,339,388 B2* | 12/2012 | Rivet | G09G 5/00 |
| | | | 345/204 |
| 2001/0014042 A1* | 8/2001 | Kato | G11C 11/4074 |
| | | | 365/200 |
| 2004/0066700 A1* | 4/2004 | Lee | G11C 8/12 |
| | | | 365/232 |
| 2007/0189096 A1 | 8/2007 | Lee | |
| 2009/0185440 A1 | 7/2009 | Lee | |
| 2010/0214822 A1* | 8/2010 | Ware | G11C 11/4074 |
| | | | 365/189.11 |
| 2012/0008446 A1 | 1/2012 | Kim | |
| 2020/0013451 A1 | 1/2020 | Son | |

FOREIGN PATENT DOCUMENTS

| | | |
|---|---|---|
| CN | 101788963 A | 7/2010 |
| CN | 105895148 A | 8/2016 |
| CN | 110675904 A | 1/2020 |
| CN | 111902871 A | 11/2020 |

* cited by examiner

MEMORY CIRCUIT, METHOD AND DEVICE FOR CONTROLLING PRE-CHARGING OF MEMORY

CROSS-REFERENCE TO RELATED APPLICATIONS

This is a continuation of International Application No. PCT/CN2021/106734, filed on Jul. 16, 2021, and entitled "Memory Circuit, Method and Device for Controlling Pre-charging of Memory", which claims priority to Chinese Patent application No. 202110352501.6, filed on Mar. 31, 2021 and entitled "Memory Circuit, Method and Device for Controlling Pre-charging of Memory". The disclosures of International Application No. PCT/CN2021/106734 and Chinese Patent application No. 202110352501.6 are hereby incorporated by reference in their entireties.

TECHNICAL FIELD

The disclosure relates to the technical field of integrated circuits, in particular to a memory circuit, a method, an electronic device and a computer device for controlling pre-charging of a memory.

BACKGROUND

During an operation of a memory, a data line needs to be pre-charged to a preset voltage; that is, a pre-charging operation is performed.

Each time a traditional memory enters a row active state, a preset voltage is input into the data line in the memory array, and thus, a preparation is made for subsequent reading-writing operations. Therefore, an active current IDD0 may be increased, and if no subsequent reading-writing operation is performed in the row active state, this portion of the current will be wasted.

SUMMARY

The disclosure provides a memory circuit, which includes a pre-charging circuit and a control circuit. The pre-charging circuit includes a first pre-charging unit, a second pre-charging unit, a first power supply terminal, a second power supply terminal, a first control terminal, a second control terminal and a data terminal. The first pre-charging unit is connected with the first power supply terminal, the first control terminal and the data terminal; the second pre-charging unit is connected with the second power supply terminal, the second control terminal and the data terminal; and a first pre-charging voltage is input into the first power supply terminal, and a second pre-charging voltage is input into the second power supply terminal.

A first output terminal of the control circuit is connected with the first control terminal, and a second output terminal of the control circuit is connected with the second control terminal. The control circuit is configured to:

in response to a memory being not in a row active state, control, through the second pre-charging unit, the data terminal and the second power supply terminal to be connected, and control, through the first pre-charging unit, the data terminal and the first power supply terminal to be disconnected;

in response to the memory being in the row active state and not performing a reading-writing operation, control, through the second pre-charging unit, the data terminal and the second power supply terminal to be disconnected, and control, through the first pre-charging unit, the data terminal and the first power supply terminal to be disconnected;

in response to the memory being in the row active state, during a preset time period after the reading-writing operation is started, control, through the second pre-charging unit, the data terminal and the second power supply terminal to be disconnected, and control, through the first pre-charging unit, the data terminal and the first power supply terminal to be connected; and in response to the memory being in the row active state, after the preset time period after the reading-writing operation is started, control, through the second pre-charging unit, the data terminal and the second power supply terminal to be disconnected, and control, through the first pre-charging unit, the data terminal and the first power supply terminal to be disconnected.

The disclosure further provides an electronic device, including the memory circuit.

The disclosure further provides a memory circuit, a method, an electronic device and a computer device for controlling pre-charging of a memory, applied to a pre-charging circuit of the memory. The pre-charging circuit includes a first pre-charging unit, a second pre-charging unit, a first power supply terminal, a second power supply terminal, a first control terminal, a second control terminal and a data terminal. The first pre-charging unit is connected with the first power supply terminal, the first control terminal and the data terminal; the second pre-charging unit is connected with the second power supply terminal, the second control terminal and the data terminal; and a first pre-charging voltage is input into the first power supply terminal, and a second pre-charging voltage is input into the second power supply terminal. The method includes the following operations.

In response to the memory being not in a row active state, the data terminal and the second power supply terminal are controlled, through the second pre-charging unit, to be connected, and the data terminal and the first power supply terminal are controlled, through the first pre-charging unit, to be disconnected.

In response to the memory being in the row active state and not performing a reading-writing operation, the data terminal and the second power supply terminal are controlled, through the second pre-charging unit, to be disconnected, and the data terminal and the first power supply terminal are controlled, through the first pre-charging unit, to be disconnected.

In response to the memory being in the row active state, during a preset time period after the reading-writing operation is started, the data terminal and the second power supply terminal are controlled, through the second pre-charging unit, to be disconnected, and the data terminal and the first power supply terminal are controlled, through the first pre-charging unit, to be connected.

In response to the memory being in the row active state, after the preset time period after the reading-writing operation is started, the data terminal and the second power supply terminal are controlled, through the second pre-charging unit, to be disconnected, and the data terminal and the first power supply terminal are controlled, through the first pre-charging unit, to be disconnected.

The disclosure further provides a computer device, including a memory and a processor. The memory stores computer programs. When the processor executes the computer programs, the steps of the method in any one of the aforementioned descriptions of the disclosure are realized.

BRIEF DESCRIPTION OF THE DRAWINGS

In order to better clarify the technical solution of embodiments of the disclosure or the conventional technology, the drawings required to illustrate the embodiments or the conventional technology will be simply described blow. It is apparent that the drawings described below merely illustrate some embodiments of the disclosure. Those of ordinary skill in the art can obtain other drawings without creative labor on the basis of those drawings.

DESCRIPTION OF REFERENCE NUMERALS

10. Pre-charging circuit; 11. First pre-charging unit; 111, First switch unit; 112. Second switch unit; 12. Second pre-charging unit; 121. Third switch unit; 122. Fourth switch unit; 20. Control circuit; 21, First inverting unit; 22. Delay unit; 23. Second inverting unit; 24, NOR gate; 25. Third inverting unit; 26. Inverter.

DETAILED DESCRIPTION

In order to facilitate the understanding of the disclosure, the disclosure will be described more comprehensively below with reference to the related drawings. The drawings show preferred embodiments of the disclosure. However, the disclosure may be implemented in various forms and may not be limited to the embodiments described herein. On the contrary, these embodiments are provided to make the understanding of the disclosure more thorough and comprehensive.

Unless otherwise defined, all technical and scientific terms used herein have the same meanings as commonly understood by those skilled in the art of the disclosure. Terms used in the description of the disclosure herein are only for the purpose of describing specific embodiments, and not intended to limit the disclosure.

It should be understood that, although the terms "first", "second", etc. may be used herein to describe various elements, these elements should not be limited by these terms. These terms are only used to distinguish one element from another. For example, a first resistor may be referred to as a second resistor, and similarly, a second resistor may be referred to as a first resistor, without departing from the scope of the present disclosure. Both the first resistor and the second resistor are resistors, but they are not the same resistor.

It can be understood that, the "connection" in the following embodiments should be understood as an "electrical connection", a "communicative connection", etc., if there is a transfer of electrical signals or data between the connected circuits, units, etc.

As used herein, singular forms "a/an", "one", and "the" are also intended to include the plural forms, unless otherwise specified in the context. It is also to be understood that, when terms of "comprising/including" or "having", etc., designates a presence of stated features, integrals, steps, operations, components, parts or combinations thereof, but does not exclude the possibility of a presence or addition of one or more other features, integrals, steps, operations, components, parts or combinations thereof. As used herein, the term of "and/or" may include any and all combinations of the related listed items.

Figure 1:
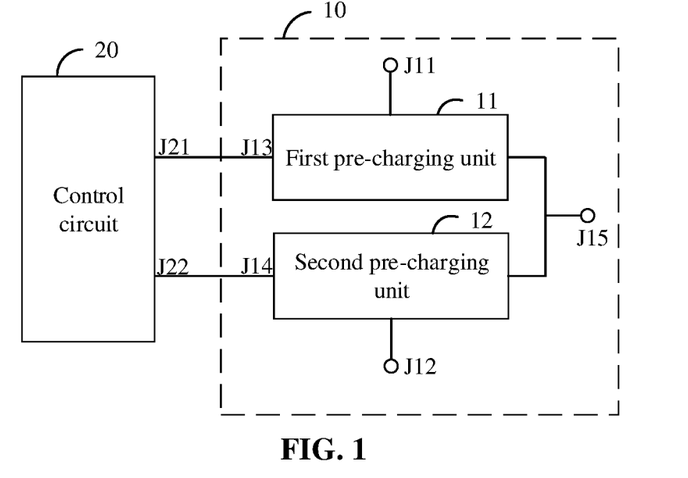
FIG. 1 is a structural block diagram of a memory circuit according to an embodiment of the disclosure.

FIG. 1 is a block diagram of a memory circuit according to an embodiment of the disclosure. As shown in FIG. 1, the memory circuit includes a pre-charging circuit 10 and a control circuit 20. The pre-charging circuit 10 includes a first pre-charging unit 11, a second pre-charging unit 12, a first power supply terminal J11, a second power supply terminal J12, a first control terminal J13, a second control terminal J14 and a data terminal J15. The first pre-charging unit 11 is connected with the first power supply terminal J11, the first control terminal J13 and the data terminal J15, and the first control terminal J13 is the control terminal of the first pre-charging unit 11. The second pre-charging unit 12 is connected with the second power supply terminal J12, the second control terminal J14 and the data terminal J15, and the second control terminal J14 is the control terminal of the second pre-charging unit 12. A first pre-charging voltage is input into the first power supply terminal J11, and a second pre-charging voltage is input into the second power supply terminal J12.

A first output terminal J21 of the control circuit 20 may be connected with the first control terminal J13, and the control circuit 20 may be configured to control the operation of the first pre-charging unit 11 by controlling signals of the first output terminal J21 of the control circuit 20. Specifically, the first power supply terminal J11 and the data terminal J15 may be controlled, through the first pre-charging unit 11, to be connected, so that the first pre-charging voltage will be input into the data terminal J15. Alternatively, the first power supply terminal J11 and the data terminal J15 may be controlled, through the first pre-charging unit 11, to be disconnected, so that the input of the first pre-charging voltage into the data terminal J15 will be stopped. Additionally, a second output terminal J22 of the control circuit 20 may be connected with the second control terminal J14, and the control circuit 20 may be configured to control the operation of the second pre-charging unit 12 by controlling signals of the second output terminal J22 of the control circuit 20. Specifically, the second power supply terminal J12 and the data terminal J15 may be controlled, through the second pre-charging unit 12, to be connected, so that the second pre-charging voltage will be input into the data terminal J15. Alternatively, the second power supply terminal J12 and the data terminal J15 may be controlled, through the second pre-charging unit 12, to be disconnected, so that the input of the second pre-charging voltage into the data terminal J15 will be stopped. The first pre-charging voltage and the second pre-charging voltage may be set according to actual requirements and may be set to be unequal. The data terminal J15 may be connected with a data line in a memory. The data line in the embodiment may be a Local Input Output line (LIO, which may also be referred to as a local input output line) in the memory.

In response to the memory being not in a row active state, the control circuit 20 is configured to control, through the second pre-charging unit 12, the data terminal J15 and the second power supply terminal J12 to be connected, and control, through the first pre-charging unit 11, the data terminal J15 and the first power supply terminal J11 to be disconnected. In response to the memory being in the row active state and not performing a reading-writing operation, the control circuit 20 is configured to control, through the second pre-charging unit 12, the data terminal J15 and the second power supply terminal J12 to be disconnected, and control, through the first pre-charging unit 11, the data terminal J15 and the first power supply terminal J11 to be disconnected. In response to the memory being in the row active state, during a preset time period after the reading-writing operation is started, the control circuit 20 is configured to control, through the second pre-charging unit 12, the data terminal J15 and the second power supply terminal J12 to be disconnected, and control, through the first pre-charging unit 11, the data terminal J15 and the first power supply terminal J11 to be connected. Moreover, in response to the memory being in the row active state, after the preset time period after the reading-writing operation is started, the control circuit 20 is configured to control, through the second pre-charging unit 12, the data terminal J15 and the second power supply terminal J12 to be disconnected, and control, through the first pre-charging unit 11, the data terminal J15 and the first power supply terminal J11 to be disconnected.

In some examples, the control circuit 20 may have a first input terminal (not shown in FIG. 1) and a second input terminal (not shown in FIG. 1). The first input terminal of the control circuit 20 may be connected with a row active signal line of the memory, so as to obtain a row active signal of the memory. The control circuit 20 may determine whether the memory is in the row active state according to the row active signal of the memory. The second input terminal of the control circuit 20 may be connected with a reading-writing signal line of the memory, so as to obtain a reading-writing signal of the memory. The control circuit 20 may determine whether the memory starts the reading-writing operation according to the reading-writing signal of the memory.

In other examples, the control circuit 20 may determine whether the memory is in the row active state and determine whether the memory starts the reading-writing operation in other manners as well.

Figure 2:
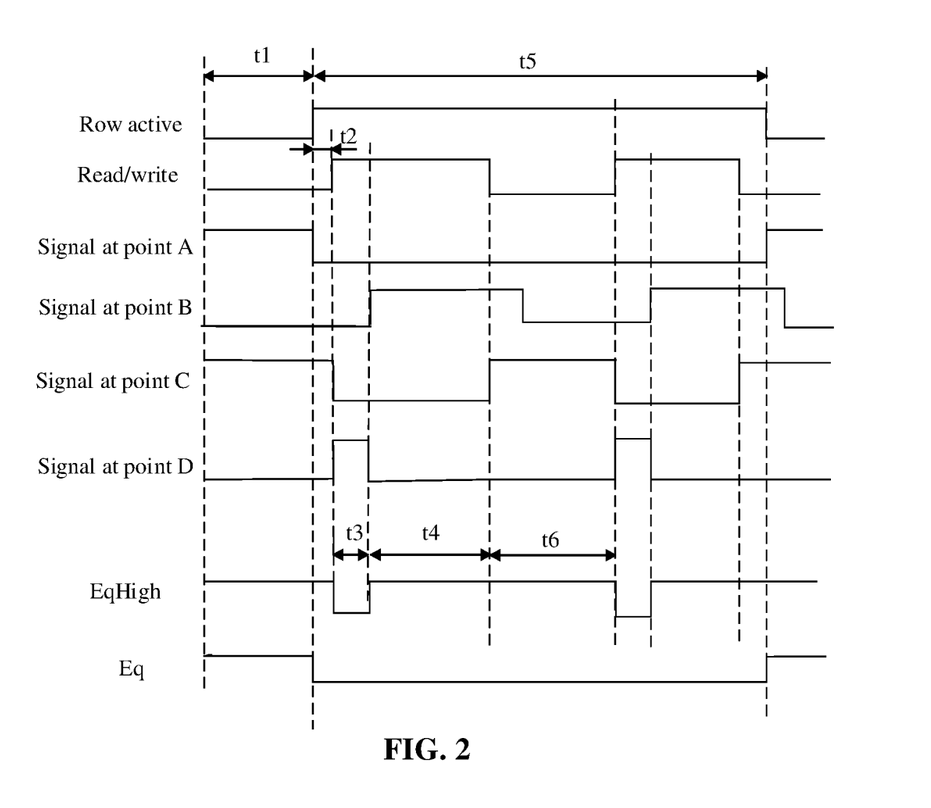
FIG. 2 is a diagram illustrating waveforms of various signals in a memory circuit according to an embodiment of the disclosure.

In some examples, when the control circuit 20 determines whether the memory is in the row active state according to the row active signal of the memory, and determines whether the memory starts the reading-writing operation according to the reading-writing signal of the memory, referring to FIGS. 1 and 2, the memory may be in the row active state, in response to the row active signal (Row active) being at a high level; and the memory may not be in the row active state, in response to the row active signal (Row active) being at a low level. Additionally, the memory may perform the reading-writing operation, in response to the reading-writing signal (Read/Write) being at a high level; and the memory may be configured not to perform the reading-writing operation in response to the reading-writing signal (Read/Write) being at a low level. The control circuit 20 may be configured to control a first control signal (EqHigh) output to the first control terminal J13 (i.e., the control terminal of the first pre-charging unit 11) of the pre-charging circuit 10 according to the row active signal (Row active). And the first pre-charging unit 11 may be configured to control whether the first power supply terminal J11 and the data terminal J15 are connected according to the first control signal (EqHigh), thereby controlling whether the first pre-charging voltage is input into the data terminal J15. The control circuit 20 may be configured to control a second control signal (Eq) output to the second control terminal J14 (i.e., the control terminal of the second pre-charging unit 12) of the pre-charging circuit 10 according to the reading-writing signal (Read/Write). And the second pre-charging unit 12 may be configured to control whether the second power supply terminal J12 and the data terminal J15 are connected according to the second control signal (Eq), thereby controlling whether the second pre-charging voltage is input into the data terminal J15.

During a time period t1, the row active signal (Row active) may be at the low level, and the memory may not be in the row active state. The control circuit 20 may be configured to control the second control signal (Eq) output by the second output terminal J22 of the control circuit 20 to be at a high level, and the control terminal of the second pre-charging unit 12 may be configured to control the second power supply terminal J12 and the data terminal J15 to be connected after receiving the high level. The control circuit 20 may be further configured to control the first control signal (EqHigh) output by the first output terminal J21 of the control circuit 20 to be at a high level, and the control terminal of the first pre-charging unit 11 may be configured to control the first power supply terminal J11 and the data terminal J15 to be disconnected after receiving the high level. Therefore, in response to the memory being not in the row active state, the memory circuit may input the second pre-charging voltage into the data line through the data terminal J15.

During a time period t2, the row active signal (Row active) may be at the high level, and the memory may be in the row active state; and the reading-writing signal (Read/Write) may be at the low level, and the memory may be configured not to perform the reading-writing operation. The control circuit 20 may be configured to control the second control signal (Eq) output by the second output terminal J22 of the control circuit 20 to be at a low level, and the control terminal of the second pre-charging unit 12 may be configured to control the second power supply terminal J12 and the data terminal J15 to be disconnected after receiving the low level. The control circuit 20 may be further configured to control the first control signal (EqHigh) output by the first output terminal J21 of the control circuit 20 to be at a high level, and the control terminal of the first pre-charging unit 11 may be configured to control the first power supply terminal J11 and the data terminal J15 to be disconnected after receiving the high level. Therefore, in response to the memory being in the row active state and not performing the reading-writing operation, the memory circuit may not input the first pre-charging voltage into the data line through the data terminal J15 and may not input the second pre-charging voltage into the data line through the data terminal J15. And at the time, the pre-charging operation may be not performed.

During a preset time period t3, the row active signal (Row active) may be at the high level, and the memory may be in the row active state; and the reading-writing signal (Read/Write) may be at the high level; and the memory may perform the reading-writing operation. The control circuit 20 may be configured to control the second control signal (Eq) output by the second output terminal J22 of the control circuit 20 to be at the low level, and the control terminal of the second pre-charging unit 12 may be configured to control the second power supply terminal J12 and the data terminal J15 to be disconnected after receiving the low level. The control circuit 20 may be further configured to control the first control signal (EqHigh) output by the first output terminal J21 of the control circuit 20 to be at the low level, and the control terminal of the first pre-charging unit 11 may be configured to control the first power supply terminal J11 and the data terminal J15 to be connected after receiving the low level. Therefore, in response to the memory being in the row active state, during the preset time period t3 after the reading-writing operation is started, the memory circuit may input the first pre-charging voltage into the data line through the data terminal J15, and a preparation will be made for subsequent data reading-writing operations.

During a time period t4, the row active signal (Row active) may be at the high level, and the memory may be in the row active state, after the preset time period t3 after the reading-writing operation is started (i.e., when rising edges of the reading-writing signal (Read/Write) arrive, the memory starts to perform the reading-writing operation). The control circuit 20 may be configured to control the second control signal (Eq) output by the second output terminal J22 of the control circuit 20 to be at the low level, and the control terminal of the second pre-charging unit 12 may be configured to control the second power supply terminal J12 and the data terminal J15 to be disconnected after receiving the low level. The control circuit 20 may be further configured to control the first control signal (EqHigh) output by the first output terminal J21 of the control circuit 20 to be at the high level, and the control terminal of the first pre-charging unit 11 may be configured to control the first power supply terminal J11 and the data terminal J15 to be disconnected after receiving the high level. Therefore, in response to the memory being in the row active state, after the preset time period t3 after the reading-writing operation is started, the memory circuit may not input the first pre-charging voltage into the data line through the data terminal J15 and may not input the second pre-charging voltage into the data line through the data terminal J15. At the time, a storage array may be preforming the data reading-writing operation; during the reading operation, a voltage on the data line may be determined by the data (0 or 1) stored in a storage unit; and during the writing operation, the voltage on the data line may be determined by the data that is externally written.

In other embodiments, the memory may not be in the row active state in response to the row active signal (Row active) being at the high level; and the control circuit 20 may be configured to control the first control signal (EqHigh) output by the first output terminal J21 of the control circuit 20 to be at the high level. And the control circuit 20 may be further configured to control the second control signal (Eq) output by the second output terminal J22 of the control circuit 20 to be at the high level. The memory may be in the row active state, in response to the row active signal (Row active) being at the low level; and the memory may be configured not to perform the reading-writing operation, in response to the reading-writing signal (Read/Write) being at the high level. And the control circuit 20 may be configured to control the first control signal (EqHigh) output by the first output terminal J21 of the control circuit 20 to be at the high level. The control circuit 20 may be further configured to control the second control signal (Eq) output by the second output terminal J22 of the control circuit 20 to be at the low level. The memory may be in the row active state, in response to the row active signal (Row active) being at the low level; and the memory may perform the reading-writing operation, in response to the reading-writing signal (Read/Write) being at the low high level. And the control circuit 20 may be configured to control the first control signal (EqHigh) output by the first output terminal J21 of the control circuit 20 to be at the low level, during the preset time period after the reading-writing operation is started. And the control circuit 20 may be further configured to control the second control signal (Eq) output by the second output terminal J22 of the control circuit 20 to be at the low level. The memory may be in the row active state, in response to the row active signal (Row active) being at the low level; and the memory may perform the reading-writing operation, in response to the reading-writing signal (Read/Write) being at the low level. And the control circuit 20 may be configured to control the first control signal (EqHigh) output by the first output terminal J21 of the control circuit 20 to be at the high level, after the preset time period after the reading-writing operation is started. And the control circuit 20 may be further configured to control the second control signal (Eq) output by the second output terminal J22 of the control circuit 20 to be at the low level.

In other embodiments, the memory may not be in the row active state in response to the row active signal (Row active) being at the low level; and the control circuit 20 may be configured to control the first control signal (EqHigh) output by the first output terminal J21 of the control circuit 20 to be at the low level. The control terminal of the first pre-charging unit 11 may be configured to control the first power supply terminal J11 and the data terminal J15 to be disconnected after receiving the low level. The control circuit 20 may be further configured to control the second control signal (Eq) output by the second output terminal J22 of the control circuit 20 to be at the low level. And the control terminal of the second pre-charging unit 12 may be configured to control the second power supply terminal J12 and the data terminal J15 to be connected after receiving the low level. The memory may be in the row active state, in response to the row active signal (Row active) being at the high level; and the memory may be configured not to perform the reading-writing operation, in response to the reading-writing signal (Read/Write) being at the low level. The control circuit 20 may be configured to control the first control signal (EqHigh) output by the first output terminal J21 of the control circuit 20 to be at the low level. The control terminal of the first pre-charging unit 11 may be configured to control the first power supply terminal J11 and the data terminal J15 to be disconnected after receiving the low level. And the control circuit 20 may be further configured to control the second control signal (Eq) output by the second output terminal J22 of the control circuit 20 to be at the high level. The control terminal of the second pre-charging unit 12 may be configured to control the second power supply terminal J12 and the data terminal J15 to be disconnected after receiving the high level. The memory may be in the row active state, in response to the row active signal (Row active) being at the high level; and the memory may perform the reading-writing operation, in response to the reading-writing signal (Read/Write) being at the high level. And the control circuit 20 may be configured to control the first control signal (EqHigh) output by the first output terminal J21 of the control circuit 20 to be at the high level during the preset time period after the reading-writing operation is started. And the control terminal of the first pre-charging unit 11 may be configured to control the first power supply terminal J11 and the data terminal J15 to be connected after receiving the high level. The control circuit 20 may be further configured to control the second control signal (Eq) output by the second output terminal J22 of the control circuit 20 to be at the high level. And the control terminal of the second pre-charging unit 12 may be configured to control the second power supply terminal J12 and the data terminal J15 to be disconnected after receiving the high level. The memory may be in the row active state, in response to the row active signal (Row active) being at the high level; and the memory may perform the reading-writing operation, in response to the reading-writing signal (Read/Write) being at the high level. The control circuit 20 may be configured to control the first control signal (EqHigh) output by the first output terminal J21 of the control circuit 20 to be at the low level, after the preset period after the reading-writing operation is started. And the control terminal of the first pre-charging unit 11 may be configured to control the first power supply terminal J11 and the data terminal J15 to be disconnected after receiving the low level. The control circuit 20 may be further configured to control the second control signal (Eq) output by the second output terminal J22 of the control circuit 20 to be at the high level. And the control terminal of the second pre-charging unit 12 may be configured to control the second power supply terminal J11 and the data terminal J15 to be disconnected after receiving the high level.

In other examples, the row active signal (Row active) and the row active state of the memory, the reading-writing signal (Read/Write) and the reading-writing state of the memory, the control relationship between the input terminal and the output terminal of the control circuit 20, and the control relationship of the pre-charging circuit 10 may be determined in other manners, which will not be repeated one by one here.

According to the memory circuit of the disclosure, in response to the memory being in the row active state and not performing the reading-writing operation, the data terminal J15 and the second power supply terminal J12 may be controlled, through the second pre-charging unit 12, to be disconnected, and the data terminal J15 and the first power supply terminal J11 are controlled, through the first pre-charging unit 11, to be disconnected. At the time, the first pre-charging voltage may not be input into the data terminal J15, and the second pre-charging voltage may not be input into the data terminal J15, so that the data line will not be pre-charged. Therefore, the current waste when the memory is in the row active state and is configured not to perform the reading-writing operation may be avoided.

In some examples, the first pre-charging voltage may be a supply voltage VCCA of the memory, and the second pre-charging voltage may be half of the supply voltage of the memory, namely, ½VCCA. In other examples, the magnitude of the first pre-charging voltage and the second pre-charging voltage may also be set according to the actual requirements.

In some examples, the memory may be configured to perform a plurality of reading-writing operations in a cycle of the row active state. And in the cycle of the row active state of the memory, the control circuit 20 may be configured to control, through the first pre-charging unit 11, the data terminal J15 and the first power supply terminal J11 to be connected at beginning of each of the plurality of reading-writing operations, and to be disconnected after the preset time period.

Merely for example, and still referring to FIG. 2, during a cycle t5 of the row active state of the memory, a plurality of high levels may occur on the reading-writing signal (Read/Write); namely, a plurality of reading-writing operations may be performed. When a first rising edge of the reading-writing signal (Read/Write) arrives (i.e., the first reading-writing operation is started), the first control signal (EqHigh) output by the first output terminal J21 of the control circuit 20 may jump to the low level, and then may jump to the high level after the low level being maintained for the preset time t3. When a second rising edge of the reading-writing signal (Read/Write) arrives (i.e., the second reading-writing operation is started), the first control signal (EqHigh) output by the first output terminal J21 of the control circuit 20 may jump to the low level again, and then may jump to the high level after the low level being maintained for the preset time period t3. And so on, until the memory is not in the row active state. In the embodiment, when the first control signal (EqHigh) is at the low level, the pre-charging circuit 10 may be configured to control the first power supply terminal J11 and the data terminal J15 to be connected, and the first power supply terminal J11 may input the first pre-charging voltage into the data terminal J15. And when the first control signal (EqHigh) is at the high level, the pre-charging circuit 10 may be configured to control the first power supply terminal J11 and the data terminal J15 to be disconnected, and the first power supply terminal J11 may be configured to stop inputting the first pre-charging voltage into the data terminal J15.

In some examples, the first input terminal J23 of the control circuit 20 may be configured to input the row active signal (Row active), and the second input terminal J24 of the control circuit 20 may be configured to input the reading-writing signal (Read/Write). When the row active signal (Row active) is at the low level, the memory may not be in the row active state. And when the row active signal (Row active) is at the high level, the memory may be in the row active state. When the reading-writing signal (Read/Write) is at the low level, the memory may be configured not to perform the reading-writing operation; and when the reading-writing signal (Read/Write) is at the high level, the memory may be configured to perform the reading-writing operation.

Figure 3:
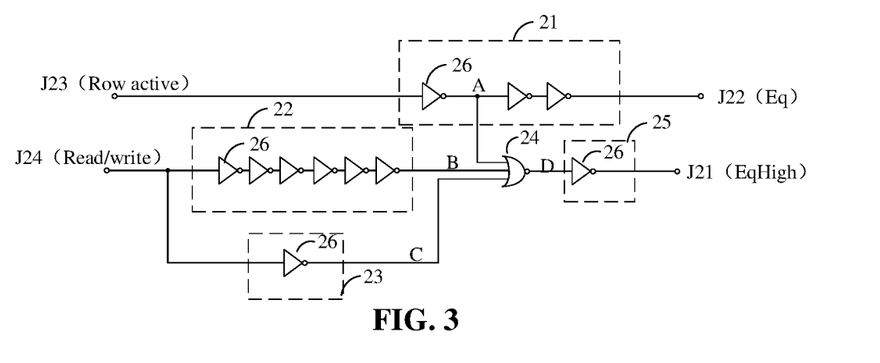
FIG. 3 is a circuit diagram of a control circuit according to an embodiment of the disclosure.

In some examples, referring to FIGS. 1 to 3, the control circuit 20 may include a first inverting unit 21, a delay unit 22, a second inverting unit 23, a NOR gate 24, and a third inverting unit 25. An input terminal of the first inverting unit 21 may be the first input terminal J23 of the control circuit 20; that is, a signal input by the input terminal of the first inverting unit 21 may be the row active signal (Row active). The first inverting unit 21 may have a first output terminal, and the first output terminal of the first inverting unit 21 may be the second output terminal J22 of the control circuit 20. The first output terminal of the first inverting unit 21 may be configured to output an inverted signal of the row active signal (Row active), so that the second control signal (Eq) output by the control circuit 20 to the control terminal of the second pre-charging unit 12 will be the inverted signal of the row active signal (Row active).

During the time period t1, the row active signal (Row active) input by the input terminal of the first inverting unit 21 may be at the low level, the memory may not be in the row active state. And after being inverted by the first inverting unit 21, the second control signal (Eq) output by the first output terminal of the first inverting unit 21 may be at the high level. The control terminal of the second pre-charging unit 12 may be configured to control the second power supply terminal J12 and the data terminal J15 to be connected after receiving the high level. And the second power supply terminal J12 may input the second pre-charging voltage into the data terminal J15.

During a time period t5, the row active signal (Row active) input by the input terminal of the first inverting unit 21 may be at the high level, the memory may be in the row active state. And after being inverted by the first inverting unit 21, the second control signal (Eq) output by the first output terminal of the first inverting unit 21 may be at the low level. The control terminal of the second pre-charging unit 12 may be configured to control the second power supply terminal J12 and the data terminal J15 to be disconnected after receiving the low level. And the second power supply terminal J12 may be configured to stop inputting the second pre-charging voltage into the data terminal J15.

The first inverting unit 21 may further have a second output terminal (see point A in FIG. 3) for outputting the inverted signal of the row active signal (Row active). The NOR gate 24 may be a three-input NOR gate. The second output terminal of the first inverting unit 21 may be connected with a first input terminal of the NOR gate 24, and a signal input by the first input terminal of the NOR gate 24 may be the inverted signal of the row active signal (Row active). An input terminal of the delay unit 22 and an input terminal of the second inverting unit 23 may be connected and may serve as the second input terminal J24 of the control circuit 20; that is, the signals input by the input terminal of the delay unit 22 and the input terminal of the second inverting unit 23 may be both the reading-writing signals (Read/Write). The delay unit 22 may be configured to delay the reading-writing signal (Read/Write) for the preset time period, and then output the reading-writing signal (Read/Write). And a second input terminal of the NOR gate 24 is connected with an output terminal (referring to point B in FIG. 3) of the delay unit 22; that is, the signal input by the second input terminal of the NOR gate 24 may be a delayed signal of the reading-writing signal (Read/Write) that is delayed for the preset time period. The second inverting unit 23 may be configured to output the inverted signal of the reading-writing signal (Read/Write). And a third input terminal of the NOR gate 24 may be connected with an output terminal (referring to point C in FIG. 3) of the second inverting unit 23; that is, the signal input by the third input terminal of the NOR gate 24 may be the inverted signal of the reading-writing signal (Read/Write). An output terminal (referring to point D in FIG. 3) of the NOR gate 24 may be connected with an input terminal of the third inverting unit 25. The third inverting unit 25 may be configured to invert the signal input by the input terminal of the third inverting unit 25, and then output the inverted signal. And the output terminal of the third inverting unit 25 may be the first output terminal J21 of the control circuit 20.

During the time period t2, the row active signal (Row active) input by the input terminal of the first inverting unit 21 may be at the high level; and the memory may be in the row active state. And the signal (i.e., the signal at the point A) output by the second output terminal of the first inverting unit 21 may be at the low level after being inverted by the first inverting unit 21; that is, the signal input by the first input terminal of the NOR gate 24 may be at the low-level. The reading-writing signals (Read/Write) input by the input terminal of the delay unit 22 and the input terminal of the second inverting unit 23 may be at the low level. The memory may be configured not to perform the reading-writing operation. And the signal (i.e., the signal at B point) output by the delay unit 22 to the second input terminal of the NOR gate 24 may be the delayed signal of the reading-writing signal (Read/Write) that is delayed for the preset time period, which may be still at the low level. After the reading-writing signal (Read/Write) being inverted by the second inverting unit 23, the signal (i.e., the signal at point C) input by the third input terminal of the NOR gate 24 may be at the high level, so that the signal (i.e., the signal at point D) output by the output terminal of the NOR gate 24 may be at the low level. After being inverting by the third inverting unit 25, the output terminal of the third inverting unit 25 may input the high level to the control terminal of the first pre-charging unit 11, so that the first pre-charging unit 11 may be configured to control the first power supply terminal J11 and the data terminal J15 to be disconnected. And the first power supply terminal J11 may be configured to stop inputting the first pre-charging voltage into the data terminal J15.

During the preset time period t3, after the memory starts the reading-writing operation, the row active signal (Row active) input by the input terminal of the first inverting unit 21 may be at the high level, and the memory may be in the row active state. And the signal output by the second output terminal of the first inverting unit 21 (i.e., the signal at point A) may be at the low level after being inverting by the first inverting unit 21; that is, the signal input by the first input terminal of the NOR gate 24 may be at the low level. The reading-writing signals (Read/Write) input by the input terminal of the delay unit 22 and the input terminal of the second inverting unit 23 may be at the high level. The memory may be configured to perform the reading-writing operation, and the signal (i.e., the signal at point B) output by the delay unit 22 to the second input terminal of the NOR gate 24 may the delayed signal of the reading-writing signal (Read/Write) that is delayed for the preset time period, which may be still at the low level. After the reading-writing signal (Read/Write) being inverted by the second inverting unit 23, the signal (i.e., the signal at point C) input by the third input terminal of the NOR gate 24 may be at the high level, so that the signal (i.e., the signal at point D) output by the output terminal of the NOR gate 24 may be at the high level. After being inverted by the third inverting unit 25, the output terminal of the third inverting unit 25 may be configured to input the low level to the control terminal of the first pre-charging unit 11, so that the first pre-charging unit 11 may be configured to control the first power supply terminal J11 and the data terminal J15 to be connected, and the first power supply terminal J11 may be configured to input the first pre-charging voltage to the data terminal J15.

After the preset time period t3, after the memory starts the reading-writing operation; for example, during the time period t4, the row active signal (Row active) input by the input terminal of the first inverting unit 21 may be at the high level, and the memory may be in the row active state. The signal (i.e., the signal at point A) output by the second output terminal of the first inverting unit 21, may be at the low level after being inverted by the first inverting unit 21; that is, the signal input by the first input terminal of the NOR gate 24 may be at the low level. The reading-writing signals (Read/Write) input by the input terminal of the delay unit 22 and the input terminal of the second inverting unit 23 may be at the high level. The memory may be configured to perform the reading-writing operation. And the signal (i.e., the signal at point B) output by the delay unit 22 to the second input terminal of the NOR gate 24 may be the delayed signal of the reading-writing signals (Read/Write) that are delayed for the preset time period t3, which may be still at the high level. After the reading-writing signal (Read/Write) being inverted by the second inverting unit 23, the signal (i.e., the signal at point C) input by the third input terminal of the NOR gate 24 may be at the low level, so that the signal output by the output terminal of the NOR gate 24 may be at the low level. After being inverted by the third inverting unit 25, the output terminal of the third inverting unit 25 may be configured to input the high level to the control terminal of the first pre-charging unit 11, so that the first pre-charging unit 11 may be configured to control the first power supply terminal J11 and the data terminal J15 to be disconnected, and the first power supply terminal J11 may be configured to stop inputting the first pre-charging voltage into the data terminal J15.

After the preset time period t3 after the memory starts the reading-writing operation; for example, during a time period t6, the row active signal (Row active) input by the input terminal of the first inverting unit 21 may be at the high level, and the memory may be in the row active state. The signal (i.e., the signal at point A) output by the second output terminal of the first inverting unit 21 may be at the low level after being inverted by the first inverting unit 21; that is, the signal input by the first input terminal of the NOR gate 24 may be at the low level. The reading-writing signals (Read/Write) input by the input terminal of the delay unit 22 and the input terminal of the second inverting unit 23 may be at the high level, and the memory may be configured not to perform the reading-writing operation. And the signal (i.e., the signal at point B) output by the delay unit 22 to the second input terminal of the NOR gate 24 may be the delayed signal of the reading-writing signals (Read/Write) that is delayed for the preset time period. After the reading-writing signal (Read/Write) jumping to the low level, the reading-writing signal (Read/Write) may jump to the low level after the high level being maintained for the preset time period t3. After the reading-writing signal (Read/Write) being inverted by the second inverting unit 23, the signal (i.e., the signal at point C) input by the third input terminal of the NOR gate 24 may be at the high level. Therefore, no matter whether the signal at point B is at the high level or at the low level in the time period t6, the signal (i.e., the signal at point D) output by the output terminal of the NOR gate 24 may be at the low level. After being inverted by the third inverting unit 25, the output terminal of the third inverting unit 25 may input the high level to the control terminal of the first pre-charging unit 11, so that the first pre-charging unit 11 may be configured to control the first power supply terminal J11 and the data terminal J15 to be disconnected, and the first power supply terminal J11 may be configured to stop inputting the first pre-charging voltage to the data terminal J15.

In some examples, referring to FIG. 3, the first inverting unit 21 may include N inverters 26 that are sequentially connected in series, an output terminal of a last inverter 26 in the first inverting unit 21 may be the first output terminal of the first inverting unit 21, and an output terminal of a NA inverter 26 in the first inverting unit 21 may be the second output terminal of the first inverting unit 21. N and $N_X$ may be positive odd numbers, and $N_X$ may be less than or equal to N. In the example of FIG. 3, N may be equal to 3, and $N_X$ may be equal to 1.

In some examples, referring to FIG. 3, the delay unit 22 may include M inverters 26 that are sequentially connected in series. M may be a positive even number. In the example of FIG. 3, M may be equal to 6. In other examples, the delay unit 22 may apply any other circuit structure known to those skilled in the art.

In some examples, referring to FIG. 3, the second inverting unit 23 may include Q inverters 26 that are sequentially connected in series. Q may be a positive odd number. In the example of FIG. 3, Q may be equal to 1.

In some examples, referring to FIG. 3, the third inverting unit 25 may include P inverters 26 that are sequentially connected in series. P may be a positive odd number. In the example of FIG. 3, P may be equal to 1.

It should be noted that, N and $N_X$ in the first inverting unit 21, M in the delay unit 22, Q in the second inverting unit 23, and P in the third inverting unit 25 will not be limited in the number of the example of FIG. 3.

Figure 4:
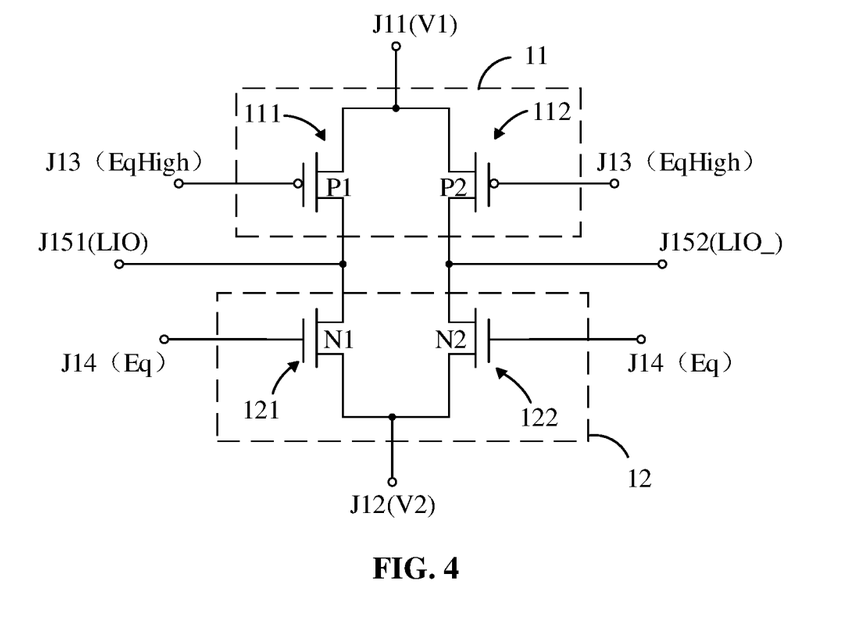
FIG. 4 is a circuit diagram of a pre-charging circuit according to an embodiment of the disclosure.

In some examples, referring to FIGS. 1 and 4, the data terminal J15 may include a first data terminal J151 and a second data terminal J152, and the first data terminal J151 and the second data terminal J152 may be configured to receive data signals that are opposite to each other. For example, the first data terminal J151 may be connected with a local data line to receive LIO signals; and the second data terminal J152 may be connected with a complementary local data line to receive the LIO_signals. The first pre-charging unit 11 may include a first switch unit 111 and a second switch unit 112. A first electrical connection terminal of the first switch unit 111 and a first electrical connection terminal of the second switch unit 112 may be both connected with the first power supply terminal J11. And the first power supply terminal J11 may be configured to input the first pre-charging voltage V1. The control terminal of the first switch unit 111 and the control terminal of the second switch unit 112 may be both connected with the first control terminal J13, so as to obtain the first control signal (EqHigh). A second electrical connection terminal of the first switch unit 111 may be connected with the first data terminal J151, and a second electrical connection terminal of the second switch unit 112 may be connected with the second data terminal J152.

Switching characteristics of the first switch unit 111 and the second switch unit 112 may be the same. The first control signal (EqHigh) output by the first output terminal J21 of the control circuit 20 may be configured to control the first electrical connection terminal and the second electrical connection terminal of the first switch unit 111 to be connected, and may be further configured to control the first electrical connection terminal and the second electrical connection terminal of the second switch unit 112 to be connected, so that the first power supply terminal J11 may be configured to simultaneously input the first pre-charging voltage V1 to the first data terminal J151 and the second data terminal J152. Alternatively, the first control signal (EqHigh) output by the first output terminal J21 of the control circuit 20 may be configured to control the first electrical connection terminal and the second electrical connection terminal of the first switch unit 111 to be disconnected, and may be further configured to control the first electrical connection terminal and the second electrical connection terminal of the second switch unit 112 to be disconnected. Therefore, the first power supply terminal J11 may be configured to stop inputting the first pre-charging voltage V1 to the first data terminal J151 and the second data terminal J152 at the same time.

The second pre-charging unit 12 may include a third switch unit 121 and a fourth switch unit 122. A first electrical connection terminal of the third switch unit 121 and a first electrical connection terminal of the fourth switch unit 122 may be both connected with the second power supply terminal J12, and thus the second pre-charging voltage V2 will be input. A control terminal of the third switch unit 121 and a control terminal of the fourth switch unit 122 may be both connected with the first control terminal J14, so as to obtain the second control signal (Eq). A second electrical connection terminal of the third switch unit 121 may be further configured to be connected with the first data terminal J151, and a second electrical connection terminal of the fourth switch unit 122 may be connected with the second data terminal J152.

Switching characteristics of the third switch unit 121 and the fourth switch unit 122 may be the same. The second control signal (Eq) output by the second output terminal J22 of the control circuit 20 may be configured to control the first electrical connection terminal and the second electrical connection terminal of the third switch unit 121 to be connected, and may be further configured to control the first electrical connection terminal and the second electrical connection terminal of the fourth switch unit 122 to be connected, so that the second power supply terminal J12 may be configured to simultaneously input the second pre-charging voltage V2 to the first data terminal J151 and the second data terminal J152. Alternatively, the second control signal (Eq) output by the second output terminal J22 of the control circuit 20 may be configured to control the first electrical connection terminal and the second electrical connection terminal of the third switch unit 121 to be disconnected, and may be further configured to control the first electrical connection terminal and the second electrical connection terminal of the fourth switch unit 122 to be disconnected. Therefore, the second power supply terminal J12 may be configured to stop inputting the second pre-charging voltage V2 to the first data terminal J151 and the second data terminal J152 at the same time.

In some examples, each of the first switch unit 111 and the second switch unit 112 may include a P-channel Metal Oxide Semiconductor (PMOS) transistor. Each of the first electrical connection terminal of the first switch unit 111 and the first electrical connection terminal of the second switch unit 112 may be the source electrode of the PMOS transistor. Each of the second electrical connection terminal of the first switch unit 111 and the second electrical connection terminal of the second switch unit 112 may be the drain electrode of the PMOS transistor. And each of the control terminal of the first switch unit 111 and the control terminal of the second switch unit 112 may be the gate electrode of the PMOS transistor. For example, referring to FIG. 4, the first switch unit may include a PMOS transistor P1 and the second switch unit may include a PMOS transistor P2.

When the first control signal (EqHigh) is at the high level, the source electrode and the drain electrode of the PMOS transistor P1 may be disconnected, the source electrode and the drain electrode of the PMOS transistor P2 may be disconnected, and the first power supply terminal J11 may be configured to stop inputting the first pre-charging voltage V1 into the first data terminal J151 and the second data terminal J152. And when the first control signal (EqHigh) is at the low level, the source electrode and the drain electrode of the PMOS transistor P1 may be connected, the source electrode and the drain electrode of the PMOS transistor P2 may be connected, and the first power supply terminal J11 may input the first pre-charging voltage V1 into the first data terminal J151 and the second data terminal J152.

Each of the third switch unit 121 and the fourth switch unit 122 may include an N-channel Metal Oxide Semiconductor (NMOS) transistor. Each of the first electrical connection terminal of the third switch unit 121 and the first electrical connection terminal of the fourth switch unit 122 may be the source electrode of the NMOS transistor. Each of the second electrical connection terminal of the third switch unit 121 and the second electrical connection terminal of the fourth switch unit 122 may be the drain electrode of the NMOS transistor. And each of the control terminal of the third switch unit 121 and the control terminal of the fourth switch unit 122 may be the gate electrode of the NMOS transistor. For example, referring to FIG. 4, the third switch unit may include a NMOS transistor N1 and the fourth switch unit may include a NMOS transistor N2.

When the second control signal (Eq) is at the high level, the source electrode and the drain electrode of the NMOS transistor N1 may be connected, the source electrode and the drain electrode of the NMOS transistor N2 may be connected, and the second power supply terminal J12 may input the second pre-charging voltage V2 to the first data terminal J151 and the second data terminal J152. And when the second control signal (Eq) is at the low level, the source electrode and the drain electrode of the NMOS transistor N1 may be disconnected, the source electrode and the drain electrode of the NMOS transistor N2 may be disconnected, and the second power supply terminal J12 may be configured to stop inputting the second pre-charging voltage V2 to the first data terminal J151 and the second data terminal J152.

The disclosure further provides an electronic device. The electronic device includes the memory circuit in any of the aforementioned embodiments.

According to the electronic device of the disclosure, in response to the memory being in the row active state and not performing the reading-writing operation, the data terminal and the second power supply terminal are controlled to be disconnected through the second pre-charging unit, and the data terminal and the first power supply terminal are controlled to be disconnected through the first pre-charging unit. At the time, the first pre-charging voltage may not be input into the data terminal, and the second pre-charging voltage may not be input into the data terminal, so that the data line will not be pre-charged. Therefore, the current waste when the memory is in the row active state and is configured not to perform the reading-writing operation may be avoided.

In some examples, the electronic device may be a memory. Further, the electronic device may be a Dynamic Random Access Memory (DRAM), or the like. In other examples, the electronic device may also be any device that contains a memory.

Figure 5:
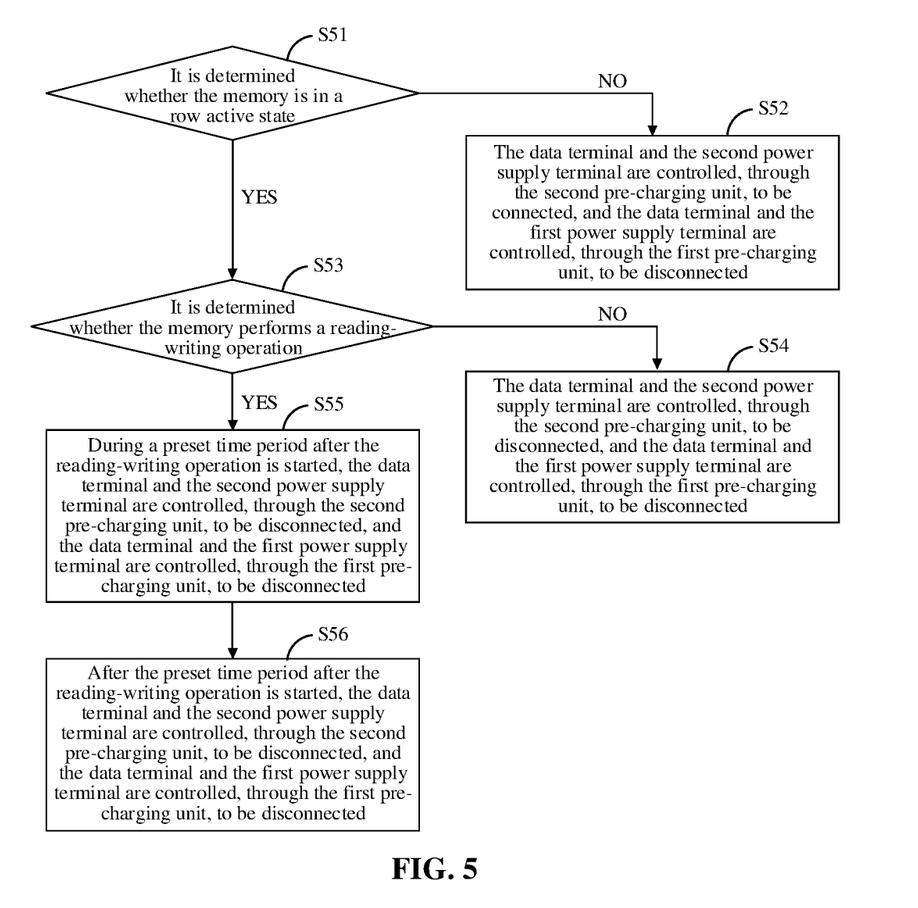
FIG. 5 is a flowchart of a method for controlling pre-charging of a memory according to an embodiment of the disclosure.

The disclosure further provides a method for controlling pre-charging of a memory. The method for controlling pre-charging of the memory is applied to a pre-charging circuit of the memory. The pre-charging circuit includes a first pre-charging unit, a second pre-charging unit, a first power supply terminal, a second power supply terminal, a first control terminal, a second control terminal and a data terminal. The first pre-charging unit is connected with the first power supply terminal, the first control terminal and the data terminal. The second pre-charging unit is connected with the second power supply terminal, the second control terminal and the data terminal. And a first pre-charging voltage is input into the first power supply terminal, and a second pre-charging voltage is input into the second power supply terminal. As shown in FIG. 5, the method for controlling pre-charging of the memory includes the following steps of S51 to S56.

In the step of S51, it is determined whether the memory is in a row active state.

If so, the step of S53 is performed; otherwise, the step of S52 is performed.

In the step of S52, the data terminal and the second power supply terminal are controlled, through the second pre-charging unit, to be connected, and the data terminal and the first power supply terminal are controlled, through the first pre-charging unit, to be disconnected.

In the step of S53, it is determined whether the memory performs a reading-writing operation.

If so, the step of S55 is performed; otherwise, the step of S54 is performed.

In the step of S54, the data terminal and the second power supply terminal are controlled, through the second pre-charging unit, to be disconnected, and the data terminal and the first power supply terminal are controlled, through the first pre-charging unit, to be disconnected.

In the step of S55, during a preset time period after the reading-writing operation is started, the data terminal and the second power supply terminal are controlled, through the second pre-charging unit, to be disconnected, and the data terminal and the first power supply terminal are controlled, through the first pre-charging unit, to be disconnected.

In the step of S56, after the preset time period after the reading-writing operation is started, the data terminal and the second power supply terminal are controlled, through the second pre-charging unit, to be disconnected, and the data terminal and the first power supply terminal are controlled, through the first pre-charging unit, to be disconnected.

According to the method for controlling pre-charging of the memory of the disclosure, in response to the memory being in the row active state and not performing the reading-writing operation, the data terminal and the second power supply terminal are controlled to be disconnected through the second pre-charging unit, and the data terminal and the first power supply terminal are controlled to be disconnected through the first pre-charging unit. At the time, the first pre-charging voltage may not be input into the data terminal, and the second pre-charging voltage may not be input into the data terminal, so that the data line will not be pre-charged. Therefore, the current waste when the memory is in the row active state and is configured not to perform the reading-writing operation may be avoided.

In some examples, the first pre-charging voltage may be a supply voltage of the memory, and the second pre-charging voltage may be half of the supply voltage of the memory.

In some examples, the memory may be configured to perform a plurality of reading-writing operations in a cycle of the row active state. And in the cycle of the row active state of the memory, the data terminal and the first power supply terminal may be controlled, through the first pre-charging unit, to be connected at beginning of each of the plurality of reading-writing operations, and to be disconnected after the preset time period. In this manner, it can be guaranteed that the data line will be pre-charged to the power voltage before each of the plurality of reading-writing operations. Then, a preparation will be made for subsequent data reading-writing operations. Meanwhile, the current waste when the memory is in the row active state and is configured not to perform the reading-writing operation may be avoided.

In some examples, in response to the row active signal being at the low level, the memory may not be in the row active state. In response to the row active signal being at the high level, the memory may be in the row active state. In response to the reading-writing signal being at the low level, the memory may be configured not to perform the reading-writing operation. And in response to the reading-writing signal being at the high level, the memory may be configured to perform the reading-writing operation.

It should be understood that while various steps in the flowchart of FIG. 5 are shown in sequence as indicated by arrows, but the steps may not be necessarily performed in sequence as indicated by arrows. Except where expressly stated herein, the execution of the steps will not be strictly limited in sequence, and the steps may be executed in other sequences. Moreover, although at least a portion of the steps in FIG. 5 include multiple steps or multiple stages, the steps or stages are not necessarily performed at the same time, but may be performed at different times. And the steps or the stages may not necessarily be performed sequentially, but may be performed in turn or in alternation with other steps or at least a portion of the steps or stages in other steps.

The disclosure further provides a computer device, including a memory and a processor. The memory stores computer programs. When the processor executes the computer programs, the steps of the method in any one of the aforementioned embodiments of the disclosure can be realized.

In the descriptions of the specification, the descriptions made with reference to terms "some embodiments", "other embodiments", "ideal embodiments", or the like may refer to that specific features, structures, materials or characteristics described in combination with the embodiment or the example that are included in at least one embodiment or example of the disclosure. In the specification, these terms may not be always schematically expressed for the same embodiment or example.

The technical features of the aforementioned embodiments may be randomly combined, and not all possible combinations of the technical features in the aforementioned embodiments are described for simplicity of description. However, as long as the combinations of the technical features do not contradict each other, they should be considered to be within the scope of the description of the present specification.

The aforementioned embodiments may merely represent several implementations of the disclosure, and the description thereof may be specific and detailed, but should not be construed as limiting the scope of disclosure accordingly. It should be pointed out that those of ordinary skill in the art can also make some modifications and improvements without departing from the concept of the disclosure. And these modifications and improvements all fall within the scope of protection of the disclosure. Accordingly, the scope of the patent of the present application should be subject to the appended claims.

The invention claimed is:

1. A memory circuit, comprising:
   a pre-charging circuit, comprising a first pre-charging unit, a second pre-charging unit, a first power supply terminal, a second power supply terminal, a first control terminal, a second control terminal and a data terminal, wherein the first pre-charging unit is connected with the first power supply terminal, the first control terminal and the data terminal; the second pre-charging unit is connected with the second power supply terminal, the second control terminal and the data terminal; and a first pre-charging voltage is input into the first power supply terminal, and a second pre-charging voltage is input into the second power supply terminal; and
   a control circuit, wherein a first output terminal of the control circuit is connected with the first control terminal, and a second output terminal of the control circuit is connected with the second control terminal; wherein the control circuit is configured to:
   in response to a memory being not in a row active state, control, through the second pre-charging unit, the data terminal and the second power supply terminal to be connected, and control, through the first pre-charging unit, the data terminal and the first power supply terminal to be disconnected;
   in response to the memory being in the row active state and not performing a reading-writing operation, control, through the second pre-charging unit, the data terminal and the second power supply terminal to be disconnected, and control, through the first pre-charging unit, the data terminal and the first power supply terminal to be disconnected;

in response to the memory being in the row active state, during a preset time period after the reading-writing operation is started, control, through the second pre-charging unit, the data terminal and the second power supply terminal to be disconnected, and control, through the first pre-charging unit, the data terminal and the first power supply terminal to be connected; and in response to the memory being in the row active state, after the preset time period after the reading-writing operation is started, control, through the second pre-charging unit, the data terminal and the second power supply terminal to be disconnected and control, through the first pre-charging unit, the data terminal and the first power supply terminal to be disconnected.

2. The memory circuit of claim 1, wherein the first pre-charging voltage is a supply voltage of the memory, and the second pre-charging voltage is half of the supply voltage of the memory.

3. The memory circuit of claim 1, wherein the memory is configured to perform a plurality of reading-writing operations in a cycle of the row active state; and in the cycle of the row active state of the memory, the control circuit is configured to control, through the first pre-charging unit, the data terminal and the first power supply terminal to be connected at beginning of each of the plurality of reading-writing operations and to be disconnected after the preset time period.

4. The memory circuit of claim 1, wherein a row active signal is input into a first input terminal of the control circuit, and a reading-writing signal is input into a second input terminal of the control circuit; wherein when the row active signal is at a low level, the memory is not in the row active state, and when the row active signal is at high level, the memory is in the row active state; and wherein the memory is configured not to perform the reading-writing operation when the reading-writing signal is at the low level, and the memory is configured to perform the reading-writing operation when the reading-writing signal is at the high level.

5. The memory circuit of claim 4, wherein the control circuit comprises a first inverting unit, a delay unit, a second inverting unit, a NOR gate, and a third inverting unit;

wherein an input terminal of the first inverting unit is the first input terminal of the control circuit, a first output terminal and a second output terminal of the first inverting unit are configured to output an inverted signal of the row active signal, and the first output terminal of the first inverting unit is the second output terminal of the control circuit;

an input terminal of the delay unit and an input terminal of the second inverting unit are connected and serve as the second input terminal of the control circuit, the delay unit is configured to delay the reading-writing signal for the preset time period and then output the reading-writing signal, and the second inverting unit is configured to output an inverted signal of the reading-writing signal;

a first input terminal of the NOR gate is connected with the second output terminal of the first inverting unit, a second input terminal of the NOR gate is connected with an output terminal of the delay unit, a third input terminal of the NOR gate is connected with an output terminal of the second inverting unit, and an output terminal of the NOR gate is connected with an input terminal of the third inverting unit; and the third inverting unit is configured to invert a signal input into the input terminal of the third inverting unit and output the inverted signal, and an output terminal of the third inverting unit is the first output terminal of the control circuit.

6. The memory circuit of claim 5, wherein the first inverting unit comprises N inverters that are sequentially connected in series, an output terminal of a last inverter in the first inverting unit is the first output terminal of the first inverting unit, and an output terminal of a $N_x$th inverter in the first inverting unit is the second output terminal of the first inverting unit; and wherein N and $N_x$ are both positive odd numbers, and $N_x$ is less than or equal to N.

7. The memory circuit of claim 5, wherein the delay unit comprises M inverters that are sequentially connected in series, and M is a positive even number.

8. The memory circuit of claim 5, wherein the second inverting unit comprises Q inverters that are sequentially connected in series, and Q is a positive odd number.

9. The memory circuit of claim 5, wherein the third inverting unit comprises P inverters that are sequentially connected in series, wherein P is a positive odd number.

10. The memory circuit of claim 1, wherein the data terminal comprises a first data terminal and a second data terminal, the first data terminal and the second data terminal being configured to receive data signals that are opposite to each other; wherein the first pre-charging unit comprises a first switch unit and a second switch unit, and a first electrical connection terminal of the first switch unit and a first electrical connection terminal of the second switch unit are both connected with the first power supply terminal, a control terminal of the first switch unit and a control terminal of the second switch unit are both connected with the first control terminal, a second electrical connection terminal of the first switch unit is connected with the first data terminal, and a second electrical connection terminal of the second switch unit is connected with the second data terminal; and wherein the second pre-charging unit comprises a third switch unit and a fourth switch unit, a first electrical connection terminal of the third switch unit and a first electrical connection terminal of the fourth switch unit are both connected with the second power supply terminal, a control terminal of the third switch unit and a control terminal of the fourth switch unit are both connected with the second control terminal, a second electrical connection terminal of the third switch unit is connected with the first data terminal, and a second electrical connection terminal of the fourth switch unit is connected with the second data terminal.

11. The memory circuit of claim 10, wherein each of the first switch unit and the second switch unit comprises a P-channel Metal Oxide Semiconductor (PMOS) transistor, each of the first electrical connection terminal of the first switch unit and the first electrical connection terminal of the second switch unit is a source electrode of the PMOS transistor, each of the second electrical connection terminal of the first switch unit and the second electrical connection terminal of the second switch unit is a drain electrode of the PMOS transistor, and each of the control terminal of the first switch unit and the control terminal of the second switch unit is a gate electrode of the PMOS transistor; and wherein each of the third switch unit and the fourth switch unit comprises an N-channel Metal Oxide Semiconductor (NMOS) transistor, each of the first electrical connection terminal of the third switch unit and the first electrical connection terminal of the fourth switch unit is a source electrode of the NMOS transistor, and each of the second electrical connection terminal of the third switch unit and the second electrical connection terminal of the fourth switch unit is a drain electrode of the NMOS transistor, and each of the control terminal of the third switch unit and the control terminal of the fourth switch unit is a gate electrode of the NMOS transistor.

12. An electronic device, comprising the memory circuit of claim 1.

13. A method for controlling pre-charging of a memory, applied to a pre-charging circuit of the memory; the pre-charging circuit comprises a first pre-charging unit, a second pre-charging unit, a first power supply terminal, a second power supply terminal, a first control terminal, a second control terminal and a data terminal; wherein the first pre-charging unit is connected with the first power supply terminal, the first control terminal and the data terminal; the second pre-charging unit is connected with the second power supply terminal, the second control terminal and the data terminal; and a first pre-charging voltage is input into the first power supply terminal, and a second pre-charging voltage is input into the second power supply terminal;

wherein the method comprises:

in response to the memory being not in a row active state, controlling, through the second pre-charging unit, the data terminal and the second power supply terminal to be connected, and controlling, through the first pre-charging unit, the data terminal and the first power supply terminal to be disconnected;

in response to the memory being in the row active state and not performing a reading-writing operation, controlling, through the second pre-charging unit, the data terminal and the second power supply terminal to be disconnected, and controlling, through the first pre-charging unit, the data terminal and the first power supply terminal to be disconnected;

in response to the memory being in the row active state, during a preset time period after the reading-writing operation is started, controlling, through the second pre-charging unit, the data terminal and the second power supply terminal to be disconnected, and controlling, through the first pre-charging unit, the data terminal and the first power supply terminal to be connected; and in response to the memory being in the row active state, after the preset time period after the reading-writing operation is started, controlling, through the second pre-charging unit, the data terminal and the second power supply terminal to be disconnected, and controlling, through the first pre-charging unit, the data terminal and the first power supply terminal to be disconnected.

14. The method for controlling pre-charging of the memory of claim 13, wherein the memory is configured to perform a plurality of reading-writing operations in a cycle of the row active state, and in the cycle of the row active state of the memory, the data terminal and the first power supply terminal are controlled through the first pre-charging unit to be connected at beginning of each of the plurality of reading-writing operations and to be disconnected after the preset time period.

15. The method for controlling pre-charging of the memory of claim 13, wherein the first pre-charging voltage is a supply voltage of the memory, and the second pre-charging voltage is half of the supply voltage of the memory.

16. An electronic device, comprising a memory and a processor, wherein the memory stores computer programs, which, when executed by the processor, causes the processor to perform steps of:

in response to the memory being not in a row active state, controlling, through a second pre-charging unit, a data terminal and a second power supply terminal to be connected, and controlling, through a first pre-charging unit, the data terminal and a first power supply terminal to be disconnected;

in response to the memory being in the row active state and not performing a reading-writing operation, controlling, through the second pre-charging unit, the data terminal and the second power supply terminal to be disconnected, and controlling, through the first pre-charging unit, the data terminal and the first power supply terminal to be disconnected;

in response to the memory being in the row active state, during a preset time period after the reading-writing operation is started, controlling, through the second pre-charging unit, the data terminal and the second power supply terminal to be disconnected, and controlling, through the first pre-charging unit, the data terminal and the first power supply terminal to be connected; and in response to the memory being in the row active state, after the preset time period after the reading-writing operation is started, controlling, through the second pre-charging unit, the data terminal and the second power supply terminal to be disconnected, and controlling, through the first pre-charging unit, the data terminal and the first power supply terminal to be disconnected.

* * * * *